(12) United States Patent
Lee et al.

(10) Patent No.: US 12,283,513 B2
(45) Date of Patent: Apr. 22, 2025

(54) CERAMIC SUSCEPTOR

(71) Applicant: MiCo Ceramics Ltd., Anseong-si (KR)

(72) Inventors: Jusung Lee, Anseong-si (KR); Yubin Lee, Anseong-si (KR); Haneum Bae, Anseong-si (KR); Sungho Lee, Anseong-si (KR)

(73) Assignee: MiCo Ceramics Ltd., Anseong-si (KR)

( * ) Notice: Subject to any disclaimer, the term of this patent is extended or adjusted under 35 U.S.C. 154(b) by 0 days.

(21) Appl. No.: 18/404,982

(22) Filed: Jan. 5, 2024

(65) Prior Publication Data
US 2024/0234194 A1 Jul. 11, 2024

(30) Foreign Application Priority Data

Jan. 5, 2023 (KR) .................. 10-2023-0001603
Nov. 7, 2023 (KR) .................. 10-2023-0152823

(51) Int. Cl.
*H01L 21/683* (2006.01)
*H01J 37/32* (2006.01)
*H01T 23/00* (2006.01)

(52) U.S. Cl.
CPC .... *H01L 21/6838* (2013.01); *H01J 37/32724* (2013.01); *H01J 37/32816* (2013.01); *H01L 21/6833* (2013.01); *H01J 2237/182* (2013.01); *H01J 2237/2007* (2013.01)

(58) Field of Classification Search
CPC ........... H01J 37/32816; H01J 2237/182; H01J 2237/2007; H01J 37/32724; H01L 21/6838; H01L 21/6833
USPC ....................................... 361/234
See application file for complete search history.

(56) References Cited

U.S. PATENT DOCUMENTS

| 6,179,924 | B1 | 1/2001 | Cao et al. | |
|---|---|---|---|---|
| 11,004,664 | B2 | 5/2021 | Hirok | |
| 2006/0186109 | A1* | 8/2006 | Goto | .................. H01L 21/67103 219/444.1 |
| 2007/0151517 | A1 | 7/2007 | Baik et al. | |
| 2009/0031955 | A1 | 2/2009 | Lu et al. | |
| 2009/0179365 | A1 | 7/2009 | Lerner et al. | |

(Continued)

FOREIGN PATENT DOCUMENTS

| JP | H03286549 A | 12/1991 |
|---|---|---|
| JP | 2002513091 A | 5/2002 |

(Continued)

OTHER PUBLICATIONS

Tanaka et al., Loading Table Structure and Processing Device (Translation of KR 2010 012 7200), Dec. 3, 2010.*

(Continued)

*Primary Examiner* — Jared Fureman
*Assistant Examiner* — Lucy M Thomas
(74) *Attorney, Agent, or Firm* — Novick, Kim & Lee, PLLC; Jae Youn Kim (57) ABSTRACT

The present disclosure relates to a ceramic susceptor, and the ceramic susceptor according to the present disclosure includes: an insulation plate on which an electrode is disposed; a shaft connected to the insulation plate; and a power supply rod connected to the electrode and extending through an inner space of the shaft, wherein the insulation plate includes a first through-passage formed through the upper surface and the lower surface thereof and configured to communicate the inner space of the shaft therewith.

11 Claims, 6 Drawing Sheets

(56) References Cited

U.S. PATENT DOCUMENTS

| | | |
|---|---|---|
| 2009/0235866 A1 | 9/2009 | Kataigi et al. |
| 2013/0248509 A1 | 9/2013 | Unno et al. |
| 2014/0252710 A1 | 9/2014 | Cuvalci et al. |
| 2016/0225651 A1 | 8/2016 | Tran et al. |
| 2017/0229326 A1 | 8/2017 | Tran et al. |
| 2017/0309509 A1 | 10/2017 | Tran et al. |
| 2018/0350610 A1 | 12/2018 | Lingampalli et al. |
| 2019/0109008 A1* | 4/2019 | Lingampalli ..... C23C 16/45514 |
| 2019/0371646 A1 | 12/2019 | Liao et al. |
| 2022/0157579 A1 | 5/2022 | Kida et al. |

FOREIGN PATENT DOCUMENTS

| | | |
|---|---|---|
| JP | 2007182622 A | 7/2007 |
| JP | 2009033178 A | 2/2009 |
| JP | 2009256789 A | 11/2009 |
| JP | 2011510488 A | 3/2011 |
| JP | 2012080103 A | 4/2012 |
| JP | 2013225663 A | 10/2013 |
| JP | 2018506853 A | 3/2018 |
| JP | 2018204104 A | 12/2018 |
| JP | 2021027161 A | 2/2021 |
| KR | 20090101093 A | 9/2009 |
| KR | 20100127200 A | 12/2010 |
| KR | 20120019620 A | 3/2012 |
| KR | 20180117436 A | 10/2018 |
| KR | 20190052804 A | 5/2019 |
| KR | 20190068163 A | 6/2019 |
| KR | 20200005783 A | 1/2020 |
| KR | 20200088500 A | 7/2020 |
| TW | M608263 U | 3/2021 |
| WO | 9956307 A1 | 11/1999 |

OTHER PUBLICATIONS

Kim et al., Substrate Supporting Unit and Substrate Processing Apparatus having the same (Translation of KR 2020 000 5783), Jan. 17, 2020.*

Notice of Allowance of KIPO for Korean application No. 1020230001603, issued on Aug. 18, 2023.

Office Action of KIPO for Korean application No. 1020230001603, issued on Mar. 9, 2023.

Office Action of JIPO for Japanese application No. 2024-000122, issued on Apr. 1, 2024.

Notice of Allowance of TIPO for Taiwanese application No. 113101304, issued on Apr. 29, 2024.

* cited by examiner

FIG. 1A

Prior Art

FIG. 1B

Prior Art

FIG. 1C

Prior Art

CERAMIC SUSCEPTOR

CROSS-REFERENCE TO RELATED APPLICATION(S)

This application is based on and claims priority under 35 U.S.C. 119 to Korean Patent Application No. 10-2023-0001603, filed on Jan. 5, 2023, and No. 10-2023-0152823, filed on Nov. 7, 2023, in the Korean Intellectual Property Office, the disclosure of which is herein incorporated by reference in its entirety.

BACKGROUND OF THE INVENTION

1. Field of the Invention

The present disclosure relates to a ceramic susceptor and, particularly, to a ceramic susceptor in which air pumping is performed through the inner space of a shaft.

2. Description of the Prior Art

Generally, a semiconductor device or display device is manufactured by sequentially stacking a plurality of thin film layers including a dielectric layer and a metal layer on a glass substrate, flexible substrate, or semiconductor wafer substrate, followed by patterning. The thin film layers are sequentially deposited on the substrate through a chemical vapor deposition (CVD) process or a physical vapor deposition (PVD) process. The CVD process includes a low pressure CVD (LPCVD) process, a plasma enhanced CVD (PECVD) process, and a metal organic CVD (MOCVD) process.

A ceramic susceptor for supporting glass substrates, flexible substrates, semiconductor wafer substrates, etc. and used for heat treatment, etc. is disposed on the CVD devices and PVD devices. The ceramic susceptor may be installed in a CVD device and a PVD device and used to heat a substrate in a heat treatment process, etc. In addition, the ceramic susceptor may be equipped with a radio frequency (RF) electrode and may also be used to form plasma in an etching process of thin film layers formed on a semiconductor wafer substrate.

Figure 1A:
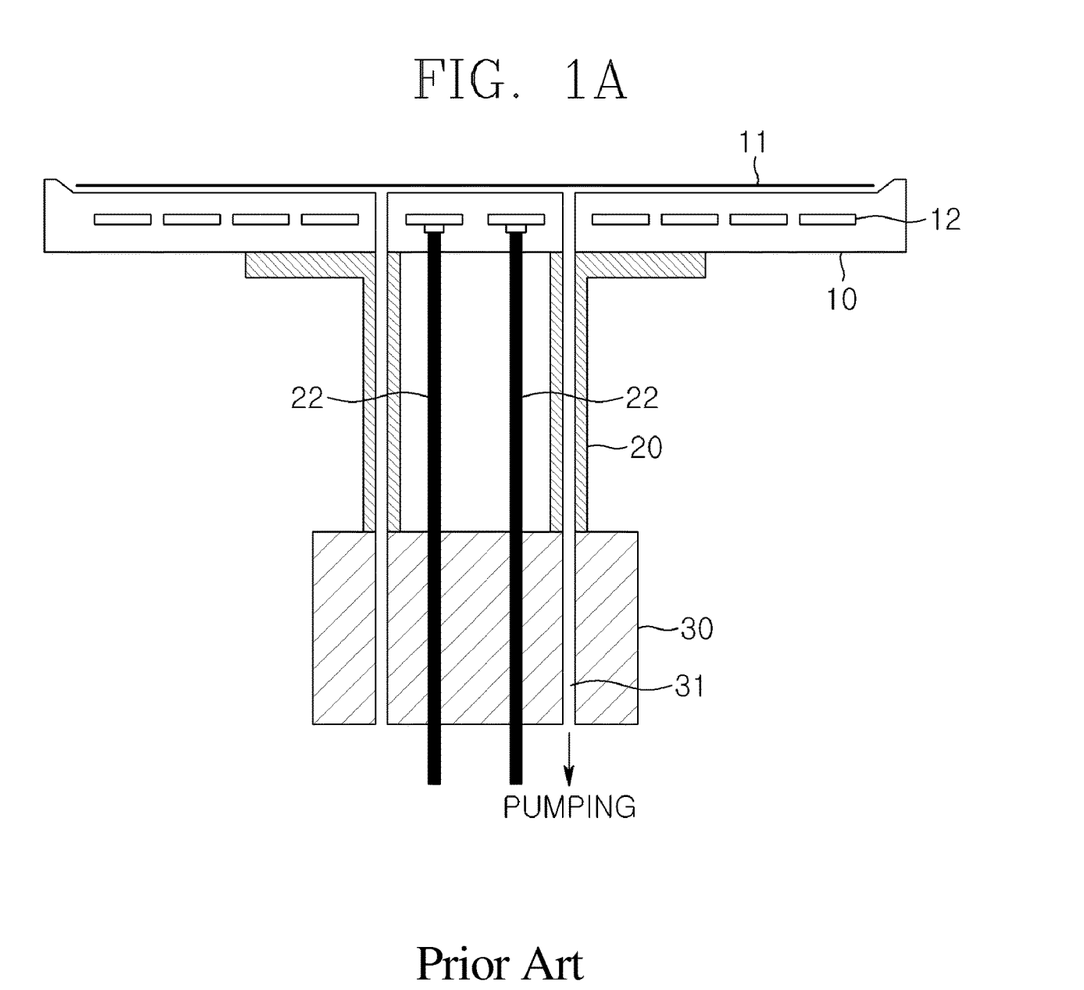
FIG. 1A is a schematic cross-sectional view of a conventional ceramic susceptor.

FIG. 1A is a schematic cross-sectional view of a conventional ceramic susceptor.

First, as shown in FIG. 1A, the conventional ceramic susceptor includes an insulation plate 10 coupled to a shaft 20, the insulation plate 10 has a heating element 12 having a mesh shape or the like and disposed in a ceramic material, the heating element 12 is connected to a connection rod 22 to receive power through a power source external to a mount 30. In addition, the conventional ceramic susceptor pumps, as a vacuum chuck function during the semiconductor process, air through a passage 31 that penetrates all of the insulation plate 10, the shaft 20, and the mount 30 in order to fix a substrate 11, such as a semiconductor wafer. Particularly, the passage 31 is formed inside the longitudinal side wall of the shaft 20. However, it is difficult to align the passage 31 in the conventional ceramic susceptor in the process of separately manufacturing the insulation plate 10, the shaft 20, and the mount 30 and then joining the same together. Accordingly, manufacturing of the conventional ceramic susceptor may reduce yield, resulting in increased processing costs.

Figure 1B:
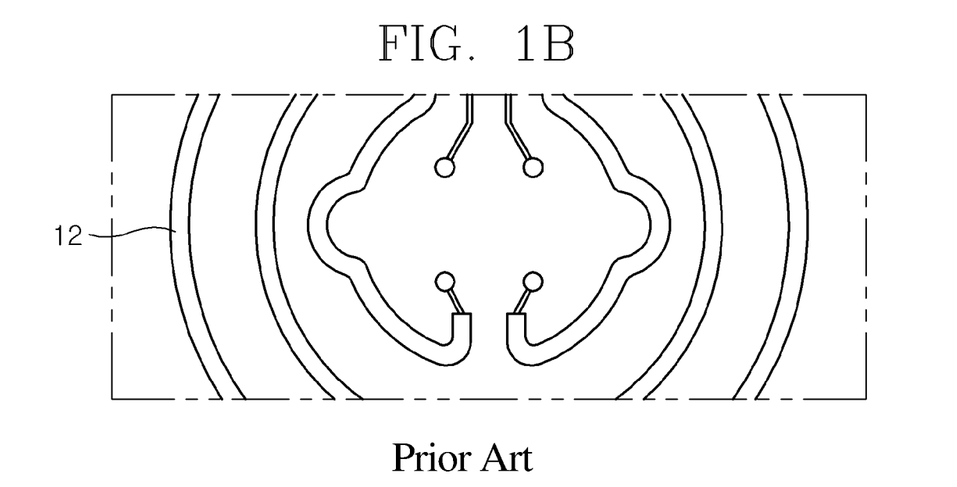
FIG. 1B is an example of a pattern of a heating element when the ceramic susceptor of FIG. 1A is viewed from above.
Figure 1C:
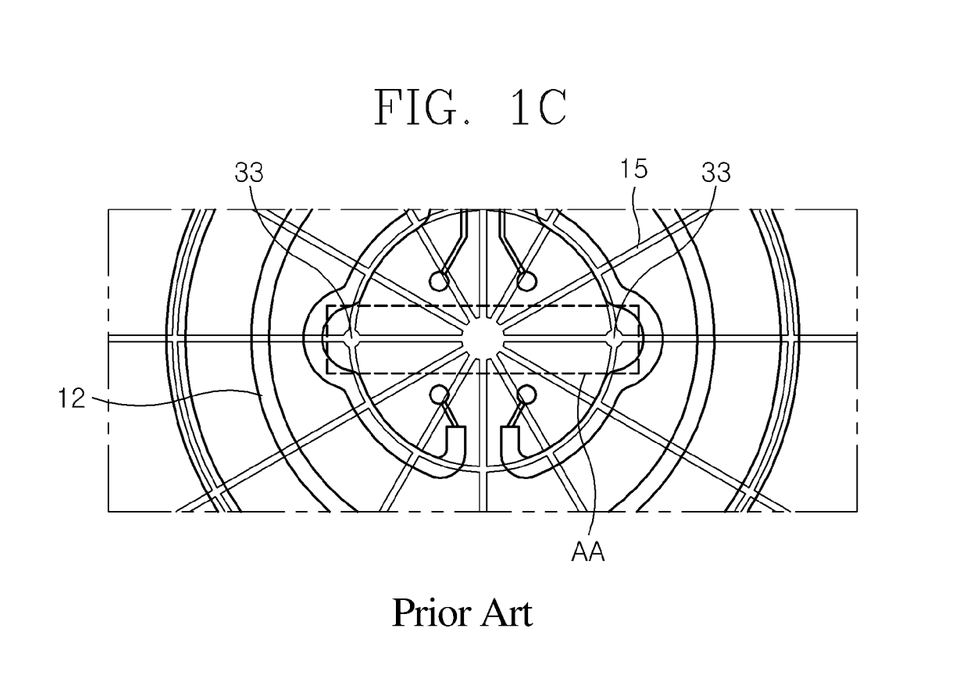
FIG. 1C illustrates the upper surface of an insulation plate and a heating element thereunder which overlap each other, when the ceramic susceptor of FIG. 1A is viewed from above.

Furthermore, the conventional ceramic susceptor described above needs to be manufactured to have the shaft 20 with a large cross-sectional area to process the through-passage 31 in the side wall of the shaft 20, resulting in increased heat loss. Furthermore, as shown in FIGS. 1B and 1C, the heating element 12 as well as the high-frequency electrodes (not shown) disposed other than the heating element 12 need to be arranged in a curved manner such that the passage 31 in the side wall of the shaft 20 avoids a hole 33 leading to the upper surface of the insulation plate 10 including a groove 15. Therefore, this also causes heat loss and reduces temperature uniformity in the surrounding zone (AA).

Related prior documents include Patent Application No. 10-2009-0020821 (Mar. 11, 2009), Patent Application No. 10-2017-0168278 (Dec. 8, 2017), International Patent Publication No. WO 1999/56307. (Nov. 4, 1999), and the like.

SUMMARY OF THE INVENTION

The present disclosure provides a ceramic susceptor enabling air pumping through the inner space of a shaft to facilitate alignment and joining of parts, improve yield, and reduce processing costs so as to enable vacuum chuck and purge functions, and enabling the vacuum chuck/purge functions to be used simultaneously with an electrostatic chuck.

In addition, the present disclosure provides a ceramic susceptor that can reduce electrical resistance and reduce the influence of shear stress by enabling a connection rod for power supply in the inner space of a shaft to be made of a single material without an anti-oxidation intermediate layer (KOVAR).

To summarize the features of the present disclosure, the ceramic susceptor according to one aspect of the present disclosure may include: an insulation plate on which an electrode is disposed; a shaft having one end connected to the insulation plate; a power supply rod connected to the electrode and extending through an inner space of the shaft; and a separator coupled to the other end of the shaft and sealing the inner space of the shaft, wherein the insulation plate may include a first through-passage formed through the upper surface and the lower surface thereof and configured to communicate the inner space of the shaft therewith, and a vacuum chuck function and/or a purge function may be performed by using the first through-passage.

The ceramic susceptor may further include a mount connected to the lower part of the shaft and including a second through-passage which communicates the inner space of the shaft with the outside.

The first through-passage is maintained at a negative pressure, which is a pressure lower than atmospheric pressure, thereby adsorbing a substrate disposed on the insulation plate.

The purge function may be performed by maintaining a positive pressure, which is a pressure higher than atmospheric pressure, through the first through-passage.

The electrode may be a heating element, and may further include an electrode for generating plasma, disposed within the insulation plate to be spaced apart from the electrode.

The insulation plate may include a second electrode disposed to be spaced apart from the electrode and used for chucking and dechucking the substrate disposed on the insulation plate, wherein chucking of the substrate is maintained using the second electrode and the purge function is simultaneously performed by maintaining a positive pressure, which is a pressure higher than atmospheric pressure, through the first through-passage.

The ceramic susceptor may further include a connector embedded in the insulation plate and electrically connected to the electrode, wherein the power supply rod may be brazed to the connector by using a conductive filler.

The power supply rod may be formed in a single rod and be in contact with the connector to extend through the mount under the shaft via the inner space of the shaft.

The connector and the power supply rod may be made of the identical material.

The electrode may be a heating element, an electrode for generating plasma, or a chuck electrode for an electrostatic chuck function.

The electrode may be a heating element, and may further include a chuck electrode for an electrostatic chuck function, disposed within the insulation plate and spaced apart from the electrode.

When the vacuum chuck function is performed using the first through-passage, the electrostatic chuck function may be further performed using the electrode.

A ceramic susceptor according to the present disclosure is configured to enable air pumping for substrate chucking through the inner space of a shaft to facilitate alignment and joining of parts, thereby improving yield and reducing processing costs.

In addition, the present disclosure does not require machining to form a through-hole in the side wall of the shaft, thus allowing the cross-sectional area of the shaft to be small, thereby reducing heat loss compared to the prior art. In addition, the present disclosure may realize chucking or purging functions by using a through-passage formed through the central part, so that built-in heating element or electrode does not need to be arranged in a curved manner to avoid the through-passage formed through the central part, thereby improving temperature uniformity in the zone (BB in FIG. 2C) around the through-passage compared to the prior art.

Furthermore, since a connection rod for power supply in the inner space of the shaft may be made of a single material without an intermediate layer (KOVAR) for stress buffering, the electrical resistance of the connection rod can be reduced and the cracking or arcing due to shear stress can be reduced.

In addition, the vacuum chuck function is realized using the inner space at the center of the shaft, and the electrostatic chuck function is used simultaneously through the chuck electrode. Therefore, when the chucking force of the vacuum chuck function is weak in a low-pressure atmosphere within a semiconductor processing chamber, the chucking force is supplemented through electrostatic chuck electrodes, and when the chucking force through the electrostatic chuck electrode is weak in a high-temperature atmosphere within the semiconductor processing chamber, not only the chucking force is supplemented through the vacuum chuck function, but also the thermal conductivity of the shaft can be reduced by vacuum in the inner space of the shaft at high temperatures (vacuum reduces thermal conductivity), and oxidation of a power supply rod inside the shaft can be reduced (vacuum also reduces oxidation).

BRIEF DESCRIPTION OF THE DRAWINGS

The accompanying drawings, which are included as part of the detailed description to aid understanding of the present disclosure, provide embodiments of the present disclosure and explain the technical idea of the present disclosure along with the detailed description.

DETAILED DESCRIPTION OF THE EXEMPLARY EMBODIMENTS

Hereinafter, the present disclosure will be described in detail with reference to the attached drawings. Here, the same components in each drawing are indicated by the same symbols whenever possible. In addition, detailed descriptions of already known functions and/or configurations will be omitted. The content disclosed below focuses on the parts necessary to understand operations according to various embodiments, and descriptions of elements that may obscure the gist of the explanation are omitted. In addition, some components in the drawings may be exaggerated, omitted, or shown schematically. The size of each component does not necessarily reflect the actual size, and therefore, the content described here is not limited by the relative size or spacing of the components shown in each drawing.

In describing the embodiments of the present disclosure, if it is determined that a detailed description of the known technology related to the present disclosure may unnecessarily obscure the gist of the present disclosure, the detailed description will be omitted. In addition, the terms described below are terms defined in consideration of functions in the present disclosure, and may vary depending on the intention or custom of the user or operator. Therefore, the definition should be made based on the contents throughout this specification. The terms used in the detailed description are only for describing embodiments of the present disclosure and should not be limiting in any way. Unless explicitly stated otherwise, singular forms include plural meanings. In this description, expressions such as "comprising" or "including" are intended to indicate certain features, numbers, steps, operations, elements, parts or combinations thereof, and it should not be construed to exclude the existence or possibility of one or more than those described or any other characteristic, number, step, operation, element, or part or combination thereof.

While terms, such as "first", "second", etc., may be used to describe various components, such components must not be limited by the above terms. The above terms are used only to distinguish one component from another.

Figure 2A:
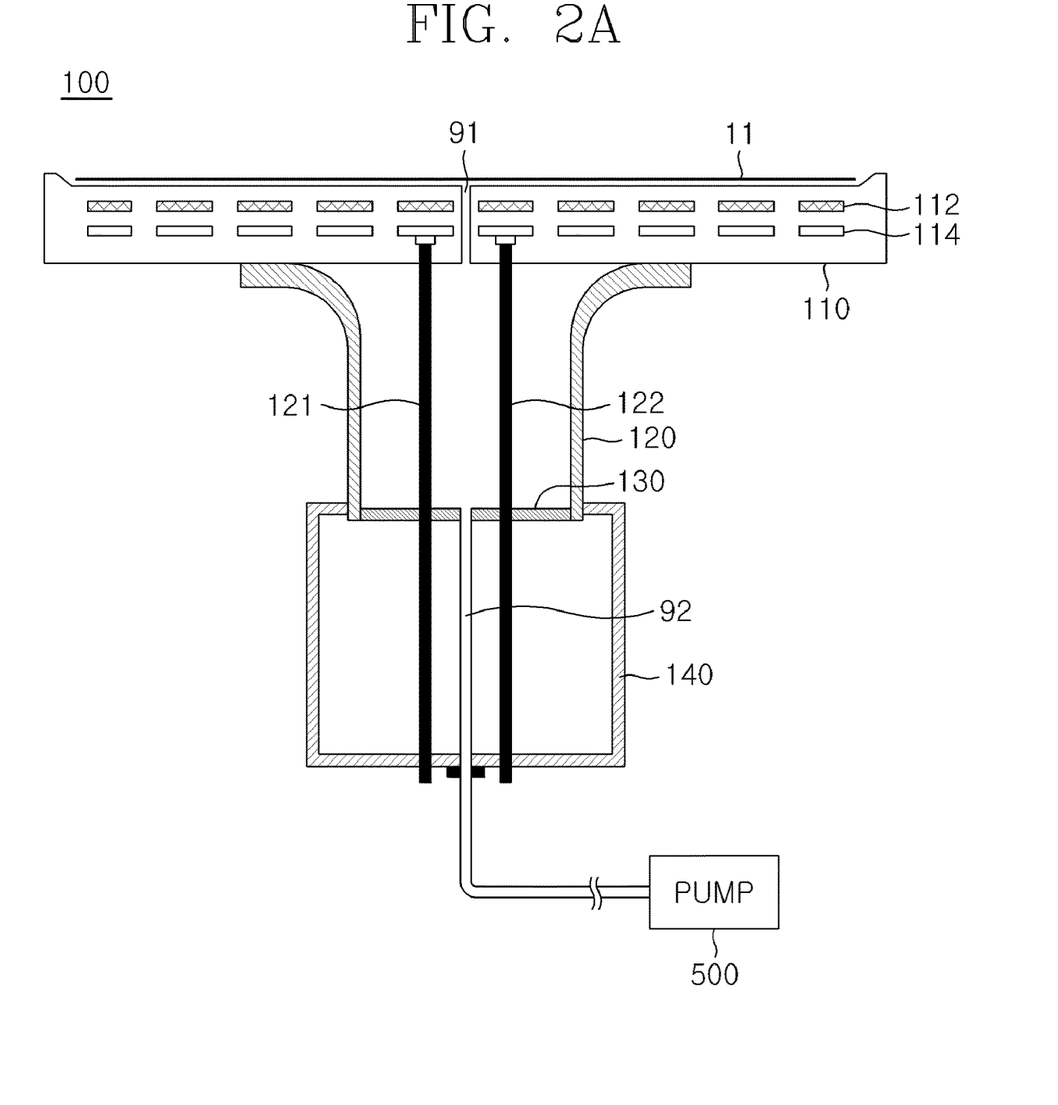
FIG. 2A is a schematic cross-sectional view of a ceramic susceptor according to an embodiment of the present disclosure.

FIG. 2A is a schematic cross-sectional view of a ceramic susceptor according to an embodiment of the present disclosure.

Referring to FIG. 2A, the ceramic susceptor 100 according to an embodiment of the present disclosure includes an insulation plate 110, a shaft 120, and a mount 140. The insulation plate 110, the shaft 120, and the mount 140 are sequentially connected, and a separator 130 formed at the longitudinal end of the shaft 120 may be included in a space between the shaft 120 and the mount 140 to separate the inner spaces thereof.

The ceramic susceptor 100 according to an embodiment of the present disclosure has a vacuum chuck structure configured to support a substrate 11 to be processed for various purposes, such as a semiconductor wafer, a glass substrate, a flexible substrate, by using an air pump 500.

To this end, the insulation plate 110 may be configured to include a heating element (electrode) 114 disposed (buried) between ceramic materials, and in some cases, may be further configured to include another electrode 112 disposed (buried) at a predetermined distance from the heating element 114. The insulation plate 110 may be configured, while stably supporting the substrate to be processed, to be used for heating the substrate by using the heating element 114 and/or supporting the substrate by using the electrode 112, or enable various semiconductor processes including a plasma-enhanced chemical vapor deposition process, a dry etching process using plasma, or the like. The insulation plate 110 may be formed as a plate-shaped structure having a predetermined shape. As an example, the insulation plate 110 may be formed as a circular plate-shaped structure, but is not necessarily limited thereto. Here, the ceramic materials may include at least one of Al2O3, Y2O3, Al2O3/Y2O3, ZrO2, autoclaved lightweight concrete (AlC), TiN, AlN, TiC, MgO, CaO, CeO2, TiO2, BxCy, BN, SiO2, SiC, YAG, Mullite, and AlF3, and may be preferably aluminum nitride (AlN). Furthermore, the powder obtained from the ceramic material may be molded and sintered to form the insulation plate 110, and each ceramic powder for this may optionally contain about 0.1 to 10%, preferably about 1 to 5%, of yttrium oxide powder.

The heating element (electrode) 114 may be formed in the form of a plate-shaped coil or a flat plate using a heating wire (or resistance wire). In addition, the heating element 114 may be formed in a multi-layer structure for precise temperature control. The heating element 114 may be connected to a power source to be provided to the separate heating element 114 through the connection rods 121 and 122 to receive power, and perform the function of heating the substrate 11 to be processed on the insulation plate 110 to a predetermined temperature in order to perform substrate heating, deposition process, etching process, etc. in the semiconductor process. The connection rods 121 and 122 may pass through the inner space of the shaft 120, the separator 130, and the mount 140 to extend outwards.

The electrode 112 may be made of tungsten (W), molybdenum (Mo), silver (Ag), gold (Au), niobium (Nb), titanium (Ti), aluminum nitride (AlN), or an alloy thereof, and may be preferably made of molybdenum (Mo). The electrode 112 may be connected to a power terminal (e.g., ground) through another connection rod (not shown). A connection rod (not shown) for the electrode 112 may also pass through the inner space of the shaft 120, the separator 130, and the mount 140 to extend outwards. For example, the electrode 112 may be used as a chuck electrode for an electrostatic chuck function to support the substrate 11 placed on the insulation plate 110, or may also be used as a plasma generation electrode for the plasma generation function for processes such as dry etching in plasma-enhanced chemical vapor deposition or reactive ion etch (RIE) equipment.

The shaft 120 has a pipe shape having a through-hole and is coupled to the lower surface of the insulation plate 110. The shaft 120 may be formed of the same ceramic material as the insulation plate 110 to be coupled thereto. Here, the ceramic materials may include at least one of Al2O3, Y2O3, Al2O3/Y2O3, ZrO2, autoclaved lightweight concrete (AlC), TiN, AlN, TiC, MgO, CaO, CeO2, TiO2, BxCy, BN, SiO2, SiC, YAG, Mullite, and AlF3, and may be preferably aluminum nitride (AlN). Furthermore, the powder obtained from the ceramic material may be molded and sintered to form the shaft 120, and each ceramic powder for this may optionally contain about 0.1 to 10%, preferably about 1 to 5%, of yttrium oxide powder.

The shaft 120 may be coupled to the insulation plate 110 by using a bonding material 125 such as ceramic paste. In some cases, the shaft 120 may be mechanically coupled to the insulation plate 110 by using bolts, nuts, etc. The shaft 120 accommodates the respective rods 121, 122, etc. that supplies power to the electrode 112 and/or the heating element 114 through the inner space formed therethrough 120, and the rods pass through the mount 140 having the sealed outer side (e.g., a rigid body or a member having a hollow space) to extend outwards.

As shown in FIG. 2A, the mount 140 is connected to the longitudinal end of the shaft 120. The mount 140 may be mechanically coupled to the shaft 120 with the separator 130 formed at the longitudinal end of the shaft 120 and interposed therebetween. The shaft 120 and the separator 130 may be coupled to each other mechanically using bolts, nuts, etc. In addition, the shaft 120, the separator 130, and the upper part of the mount 140 may be mechanically coupled to each other using bolts, nuts, etc., and may be sealed to ensure complete hermeticity. The area around the through-holes of the separator 130 for the connection rods 121, 122, etc. that penetrate the separator 130 may be sealed tightly using a paste made of the above-described ceramic material, etc. The upper part of the mount 140 may be fastened to surround the separator 130. The gap between the upper part of the mount 140 and the separator 130 or between the upper part of the mount 140 and the shaft 120, that is, the coupled part of the shaft 120 and the mount 140 having the separator 130 may be hermetically sealed with a paste made of the above ceramic material, etc.

The connection mount 140 and the separator 130 described above may be made of a metal material such as aluminum (Al), or may be made of a ceramic material as described above. That is, the ceramic material may include at least one of Al2O3, Y2O3, Al2O3/Y2O3, ZrO2, autoclaved lightweight concrete (AlC), TiN, AlN, TiC, MgO, CaO, CeO2, TiO2, BxCy, BN, SiO2, SiC, YAG, and AlF3, and may be preferably aluminum nitride (AlN). Furthermore, the powder obtained from the ceramic material may be molded and sintered to form the shaft 120, and each ceramic powder for this may optionally contain about 0.1 to 10%, preferably about 1 to 5%, of yttrium oxide powder.

This ceramic susceptor 100 according to an embodiment of the present disclosure may function as a vacuum chuck by pumping air through the inner space of the shaft 120 to facilitate alignment and joining to match the air passages of parts, such as the insulation plate 110, the shaft 120, and mount 140, thereby improving yield and reducing processing costs. In addition, in the present disclosure, the inner space of the shaft 120 is maintained at a vacuum lower than atmospheric pressure (negative pressure) to prevent oxidation of the connection rods 121 and 122 in the inner space of the shaft 120, and therefore, the connection rods 121 and 122 may be implemented as a single rod rather than a double connection structure 51 and 52 (see FIG. 3), and the connection rods 121 and 122 may be made of Mo, the same material as the connector 41 (see FIGS. 3 and 4), which is electrically connected to the heating element 114 (or other electrode 112) of the insulation plate 110. That is, the connection rods 121 and 122 may be made of a single material such as Mo without the intermediate layer 51 (KOVAR) for stress buffering (see FIG. 3) to reduce the electrical resistance of the connection rods 121 and 122, thereby reducing cracking or arcing due to shear stress.

Furthermore, the ceramic susceptor 100 according to an embodiment of the present disclosure is configured to realize a vacuum chuck function using the inner space of the shaft 120 and to enable an electrostatic chuck function to be simultaneously used through the electrode 112 of the chuck electrode.

To this end, to function as the vacuum chuck by air pumping performed through the inner space of the shaft 120, the insulation plate 110 includes a first through-passage 91 for communication with the inner space of the shaft 120 and starting from the upper surface on which the substrate 11 is placed. The first through-passage 91 is formed near the center of the insulation plate 110 to penetrate the upper surface and the lower surface, and fluid communication is established between the upper surface on which the substrate 11 is placed and the inner space of the shaft 120 through the first through-passage 91. In addition, in order to function as a vacuum chuck by air pumping (vacuum pumping) performed through the inner space of the shaft 120, the mount 140 includes a second through-passage 92 that communicates the inner space of the shaft 120 with the outside. When an air pumping operation is performed by the air pump 500 connected to the second through-passage 92, air is pumped through the first through-passage 91, the inner space of the shaft 120, and the second through-passage 92 to maintain the inner space of the shaft 120 and the first through-passage 91 at a negative pressure, which is a pressure lower than atmospheric pressure, thereby adsorbing the substrate 11 disposed on the upper part of the insulation plate 110. Accordingly, when performing the vacuum chuck function using the first through-passage 91, the electrostatic chuck function may be additionally performed using the electrode 112 as an electrostatic chuck electrode. When the electrostatic chuck function is used simultaneously by receiving power for chucking and dechucking using the electrostatic chuck electrode 112 along with the vacuum chuck function using the first through-passage 91 described above, if the chucking force of the vacuum chuck function is weak in a low-pressure atmosphere within a semiconductor processing chamber, the chucking force may be supplemented through the electrostatic chuck electrode 112, and if the chucking force through the electrostatic chuck electrode 112 is weak in a high-temperature atmosphere within the semiconductor process chamber, not only the chucking force is supplemented through the vacuum chuck function, but also the thermal conductivity of the shaft 120 can be reduced by vacuum in the inner space of the shaft 120 at high temperatures (vacuum reduces thermal conductivity), and oxidation of a power supply rod inside the shaft 120 can be reduced (vacuum also reduces oxidation).

The inner part of the mount 140 may be in the form of a hard rigid body, or may be in the form of a member having a hollow space. When the mount 140 is a rigid body, the mount 140 may include a through-hole for passing the connection rods 121 and 122, and a through-hole for forming the second through-passage 92. In addition, when the mount 140 is a member having a hollow space, a through-hole for passing the connection rods 121 and 122 may be provided between the upper end and the lower end of the mount 140, and a pipe-shaped member (e.g., made of metal or ceramic material) for the second through-passage 92 may be provided between the upper end and the lower end of the mount 140.

Figure 2B:
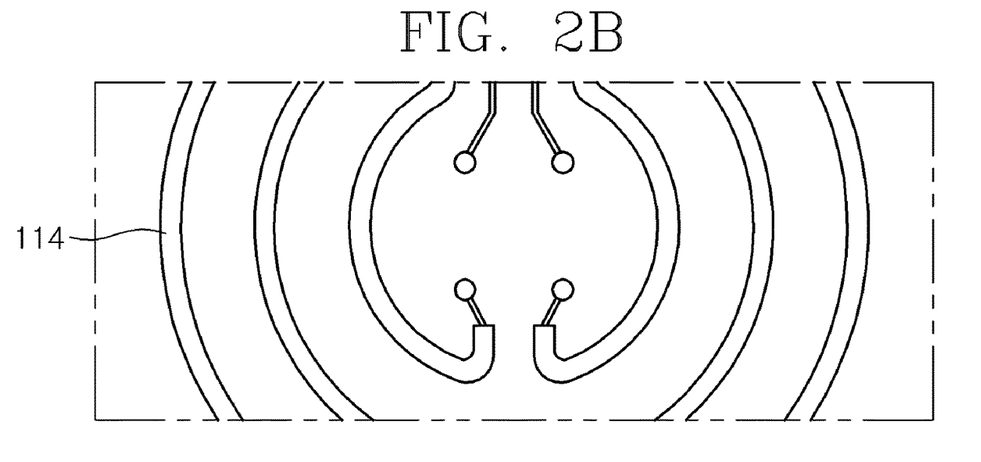
FIG. 2B is an example of a pattern of a heating element when the ceramic susceptor of FIG. 2A is viewed from above.

FIG. 2B is an example of a pattern of the heating element 114 when the ceramic susceptor 100 of FIG. 2A is viewed from above.

Figure 2C:
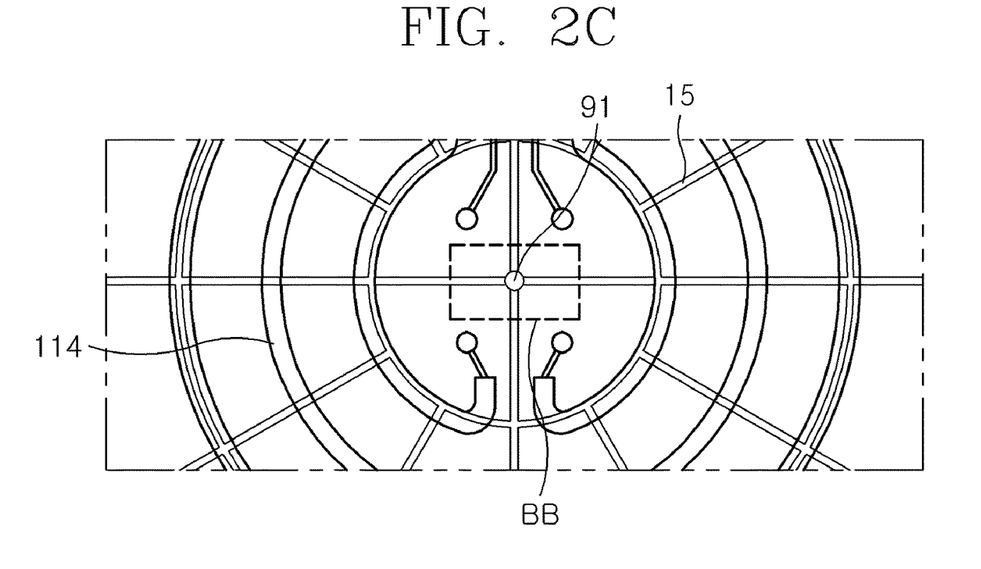
FIG. 2C illustrates the upper surface of an insulation plate and a heating element thereunder which overlap each other, when the ceramic susceptor of FIG. 2A is viewed from above.

FIG. 2C illustrates the upper surface of the insulation plate 110 and the heating element 114 thereunder which overlap each other, when the ceramic susceptor 100 of FIG. 2A is viewed from above.

Referring to FIGS. 2B and 2C, the ceramic susceptor 100 of the present disclosure does not require machining to form a through-hole in the side wall of the shaft 120, and thus the cross-sectional area of the shaft 120 may be formed to be small. Accordingly, the ceramic susceptor 100 of the present disclosure may reduce heat loss compared to the prior art (see FIGS. 1A, 1B, and 1C), and realize chucking or purging functions by using the through-passage 91 formed through the central part, so that the built-in heating element 114 or electrode 112 does not need to be arranged in a curved manner to avoid the through-passage formed through the central part, thereby improving temperature uniformity in the zone (BB in FIG. 2C) around the through-passage 91 compared to the prior art.

The ceramic susceptor 100 of the present disclosure as described above may be installed in a chamber of a CVD device and a PVD device to be used for heating the substrate by using the heating element 114 and/or supporting the substrate by using the electrode 112, or be used in a plasma enhanced-chemical vapor deposition process or a dry etching process using plasma. As described above, the ceramic susceptor 100 of the present disclosure may enable chucking and dechucking of the substrate 11 by pumping negative pressure air through the first through-passage 91, the inner space of the shaft 120, and the second through-passage 92. At this time, the insulation plate 110 may be configured, while stably supporting the substrate to be processed, to be used for heating the substrate by using the heating element 114 and/or supporting the substrate by using the electrode 112, or enable various semiconductor processes including a plasma-enhanced chemical vapor deposition process, a dry etching process using plasma, or the like.

Meanwhile, the ceramic susceptor 100 of the present disclosure not only enables chucking and dechucking of the substrate 11 by using the first through-passage 91, but also may perform a purge function by maintaining the first through-passage 91 at atmospheric pressure or higher by positive pressure air pumping performed through the first through-passage 91, the inner space of the shaft 120, and the second through-passage 92. At this time, the air pump 500 may perform pumping to inject air at a predetermined pressure higher than atmospheric pressure through the second through-passage 92.

For example, the air pump 500 may perform purging for blowing an air containing a predetermined gas (e.g., nitrogen gas and inert gas, such as He and Ar) into the chamber of the CVD device and the PVD device described above by pumping positive pressure air through the first through-passage 91.

The purging may blow away and remove particles accumulated in a pocket, especially a groove 15, on the upper surface of the insulation plate 110 in the chamber. This purge function may be preferably performed after chucking the substrate 11 on the upper surface of the insulation plate 110. However, if necessary, the purge function may also be performed even when no substrate 11 is disposed on the upper surface of the insulation plate 110. While performing the purge function, the chucking and dechucking of the substrate 11 placed on the upper surface of the plate 110 may be performed using an electrode disposed within the insulation plate 110, in addition to the heating element 114, that is, the electrode 112 as shown in FIG. 2A. That is, the electrode 112 may be a high-frequency electrode arranged to receive power for generating plasma as described above, but may also be an electrostatic chuck electrode (or chuck electrode) arranged to receive power for chucking and dechucking the substrate 11. Furthermore, the electrode 112 may be left as is to function as an electrostatic chuck electrode, and an additional chuck electrode spaced a predetermined distance from the electrode 112 may be formed to receive power for further chucking and dechucking the substrate 11. That is, the heating element 114, the electrode 112, and additional electrodes for chucking and dechucking the substrate 11 may be formed in different layers within the insulation plate 110 to be spaced a predetermined distance apart from each other.

Figure 3:
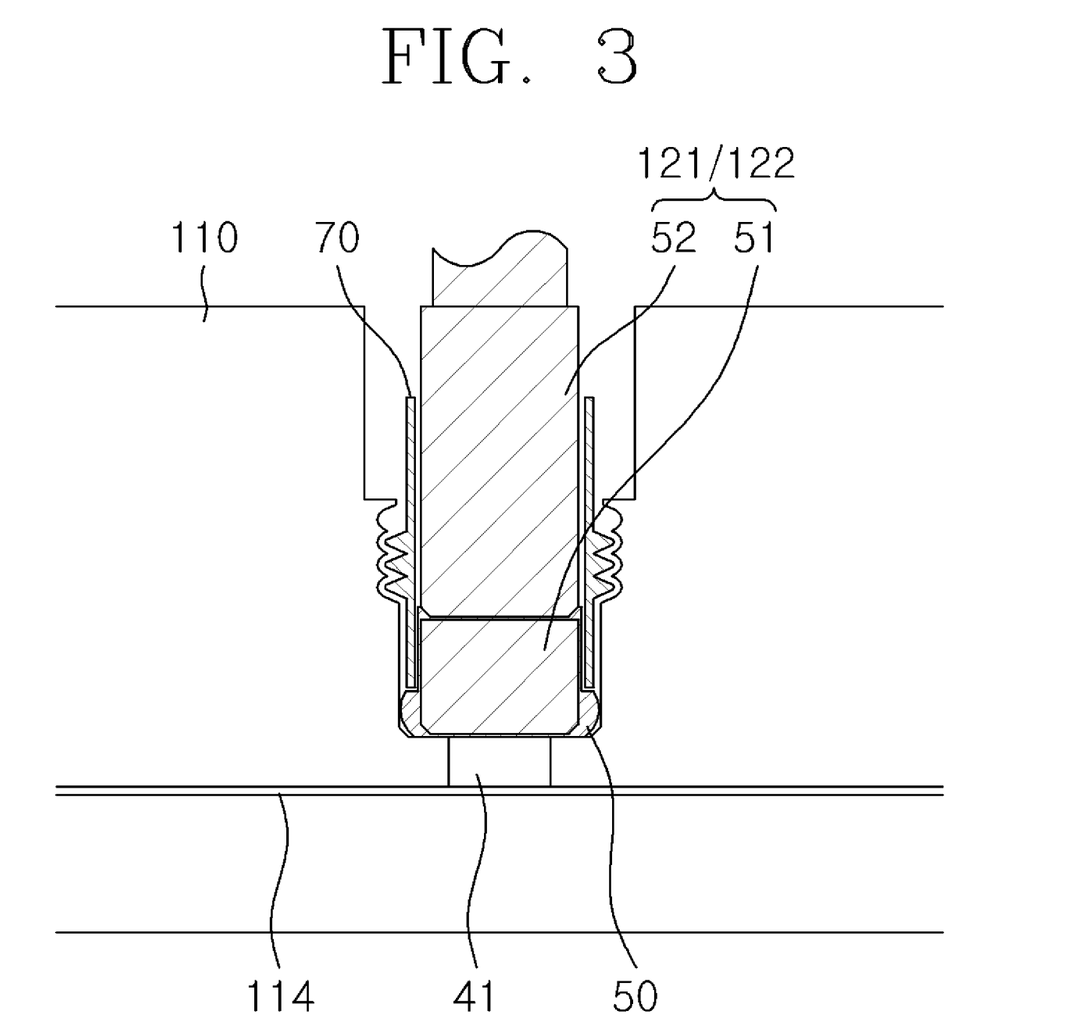
FIG. 3 is a cross-sectional view of a coupled part of a connection rod according to a first embodiment of a ceramic susceptor of the present disclosure.

FIG. 3 is a cross-sectional view of a coupled part of the connection rods 121 and 122 according to a first embodiment of the ceramic susceptor 100 of the present disclosure.

Referring to FIG. 3, the connection rods 121 and 122 may be contacted to be electrically connected to the connector 41 buried to be electrically connected to the heating element 114 (or the electrode 112) of the insulation plate 110. Here, the connection rods 121 and 122 have a double connection structure, that is, the structure including a first rod 51 and a second rod 52, through a support eyelet 70 coupled to the thread formed on a part of the inner peripheral surface of a predetermined opening formed in the insulation plate 110.

The connector 41, the connection rods 121 and 122, and the support eyelet 70 may be made of a conductive material, for example, may be made of tungsten (W), molybdenum (Mo), silver (Ag), nickel (Ni), gold (Au), niobium (Nb), titanium (Ti), or alloys thereof. In particular, as for the double connection structure of the connection rods 121 and 122, the connector 41 may be made of Mo, the first rod 51 may be made of a KOVAR (alloy of Fe—Ni—Co) material as an intermediate layer for stress buffering, and the second rod 52 may be made of Ni or the like. In addition, the connection rods 121 and 122 may be joined to the connector 41 by brazing. For example, the first rod 51 may be joined to the connector 41 by injecting a conductive filler 50 in advance around the exposed part of the connector 41 and pushing the first rod 51 into the support eyelet 70 to bring one side end surface of the first rod 51 into close contact with the connector 41, followed by cooling after heating at a high temperature, thereby achieving the electrical connection therebetween. Next, the first rod 51 may be joined to the second rod 52 by sufficiently injecting a second conductive filler 60 onto the other side end surface of the first rod 51 and pressing one side end surface of the second rod 52 closely toward the injected second conductive filler 60, followed by cooling after heating at a high temperature, thereby achieving the electrical connection therebetween.

However, the coupled part of the connecting rods 121 and 122 may be implemented by the manner described above. However, in the present disclosure, oxidation of the connection rods 121 and 122 in the inner space of the shaft 120 is prevented by maintaining a vacuum lower than atmospheric pressure in the inner space of the shaft 120, thereby forming both the connector 41 and a single rod including the connection rods 121 and 122 by using Mo.

Figure 4:
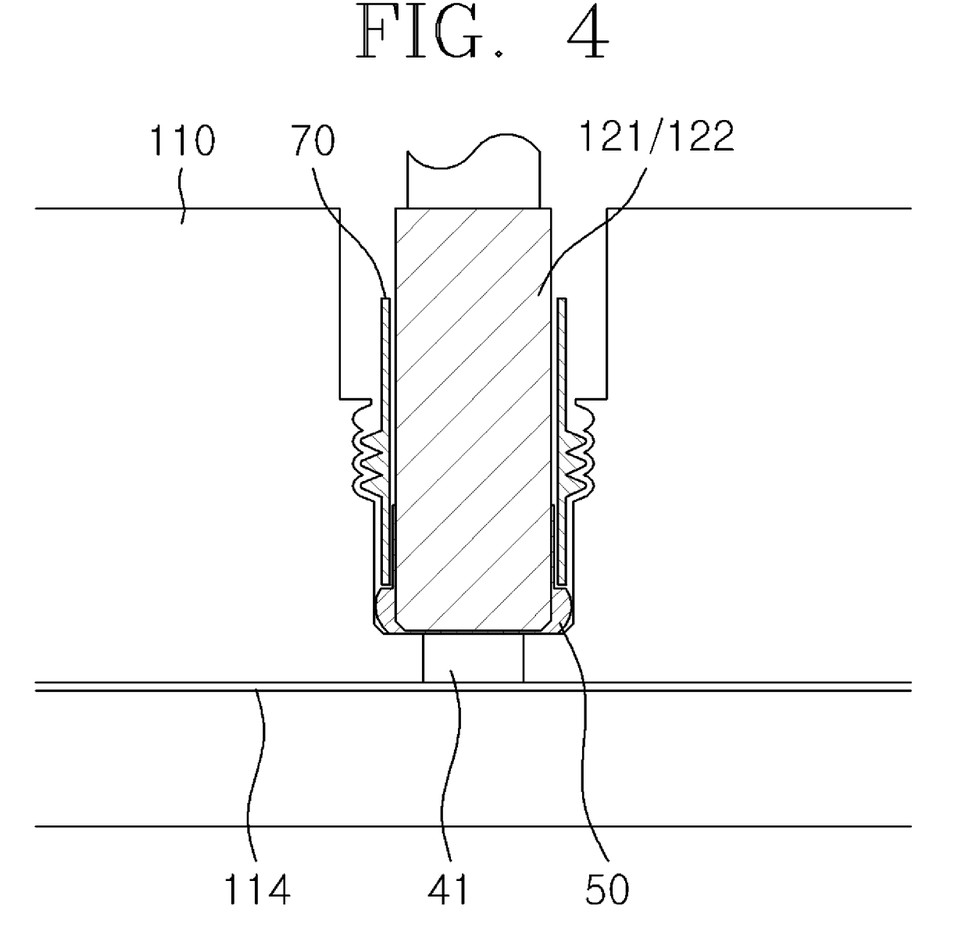
FIG. 4 is a cross-sectional view of a coupled part of a connection rod according to a second embodiment of a ceramic susceptor of the present disclosure.

FIG. 4 is a cross-sectional view of the coupled part of the connecting rods 121 and 122 according to a second embodiment of a ceramic susceptor of the present disclosure.

Referring to FIG. 4, the connecting rods 121 and 122 may be contacted to be electrically connected to the connector 41 buried to be electrically connected to the heating element 114 (or the electrode 112) of the insulation plate 110. Here, a case in which the connection rods 121 and 122 are configured as a single rod connection structure through the support eyelet 70 coupled to the thread formed on a part of the inner peripheral surface of a predetermined opening of the insulation plate 110 will be described.

The connector 41, the connection rods 121 and 122, and the support eyelet 70 may be made of a conductive material, for example, may be made of tungsten (W), molybdenum (Mo), silver (Ag), nickel (Ni), gold (Au), niobium (Nb), titanium (Ti), or alloys thereof.

In particular, in the present disclosure, the inner space of the shaft 120 is maintained at a vacuum lower than atmospheric pressure to prevent oxidation of the connection rods 121 and 122 in the inner space of the shaft 120, and therefore, the connection rods 121 and 122 may be implemented as a single rod rather than the double connection structure 51 and 52 as shown in FIG. 3, and the connection rods 121 and 122 may be made of Mo, the same material as the connector 41 electrically connected to the heating element 114 (or the electrode 112) of the insulation plate 110. That is, the connection rods 121 and 122 may be made of a single material such as Mo without the intermediate layer 51 (KOVAR) for stress buffering, as shown in FIG. 3, to reduce the electrical resistance of the connection rods 121 and 122, thereby reducing cracking or arcing due to shear stress.

Here, the connection rods 121 and 122 may be joined to the connector 41 by brazing. For example, the connection rods 121 and 122 may be joined to the connector 41 by injecting the conductive filler 50 in advance around the exposed part of the connector 41 and pushing the connection rods 121 and 122 into the support eyelet 70 to bring one side end surface of the connection rods 121 and 122 into close contact with the connector 41, followed by cooling after heating at a high temperature, thereby achieving the electrical connection therebetween.

As described above, the ceramic susceptor 100 according to the present disclosure is configured to enable air pumping for substrate chucking through the inner space of the shaft 120 to facilitate alignment and joining of parts, thereby improving yield and reducing processing costs. In addition, the present disclosure does not require machining to form a through-hole in the side wall of the shaft, and accordingly, the cross-sectional area of the shaft may be formed small. Thus, the present disclosure may reduce heat loss compared to the prior art, and realize chucking or purging functions by using the through-passage 91 formed through the central part, so that the built-in heating element or electrode does not need to be arranged in a curved manner to avoid the through-passage formed through the central part, thereby improving temperature uniformity in the zone (BB) around the through-passage 91 compared to the prior art.

In addition, the connection rods 121 and 122 in the inner space of the shaft may be made of a single material without the intermediate layer 51 (KOVAR) for stress buffering to reduce the electrical resistance of the connection rods 121 and 122, thereby reducing cracking or arcing due to shear stress.

Furthermore, the ceramic susceptor 100 according to an embodiment of the present disclosure may realize the vacuum chuck function by using the inner space of the shaft 120, and enable the electrostatic chuck function to be used simultaneously through the electrode 112 of the chuck electrode.

As described above, the present disclosure has been described with specific details such as specific components and limited embodiments and drawings, but this is only provided to facilitate a more general understanding of the present disclosure, and the present disclosure is not limited to the above embodiments. Those of ordinary skill in the field to which the present disclosure pertains will be able to make various modifications and variations without departing from the essential characteristics of the present disclosure. Therefore, the spirit of the present disclosure should not be limited to the described embodiments, and not only the scope of the patent claims described below, but also all technical ideas that are equivalent or equivalent to the scope of these claims should be construed as being included in the scope of rights of the present disclosure.

What is claimed is:

1. A ceramic susceptor comprising:
   an insulation plate on which an electrode is disposed;
   a shaft having one end connected to the insulation plate;
   a mount connected to a lower portion of the shaft;
   a separator coupled to the other end of the shaft and sealing an inner space of the shaft; and
   a power supply rod connected to the electrode and extending through the inner space of the shaft, the separator and the mount,
   wherein the insulation plate comprises a first through-passage formed through an upper surface and a lower surface thereof and is configured to communicate the inner space of the shaft therewith,
   wherein the mount includes a second through-passage that communicates the inner space of the shaft with an outside, and the second through-passage is a through-hole formed to penetrate the mount, and
   wherein a vacuum chuck function and/or a purge function are performable using the first through-passage, a through-hole of the separator, the second through-passage and the inner space of the shaft where the power supply rod is received.

2. The ceramic susceptor of claim 1, wherein the first through-passage and the second through-passage are maintained at a negative pressure, which is a pressure lower than atmospheric pressure, thereby adsorbing a substrate disposed on the insulation plate.

3. The ceramic susceptor of claim 1, wherein the purge function is performed by maintaining a positive pressure, which is a pressure higher than atmospheric pressure, through the first through-passage and the second through-passage.

4. The ceramic susceptor of claim 1, wherein the electrode is a heating element, and wherein the ceramic susceptor further comprises a plasma electrode for generating plasma, disposed within the insulation plate and spaced apart from the electrode.

5. The ceramic susceptor of claim 1, wherein the insulation plate comprises a second electrode disposed to be spaced apart from the electrode and used for chucking and dechucking a substrate disposed on the insulation plate,
   wherein the chucking of the substrate is maintained using the second electrode and the purge function is simultaneously performed by maintaining a positive pressure, which is a pressure higher than atmospheric pressure, through the first through-passage.

6. The ceramic susceptor of claim 1, further comprising a connector embedded in the insulation plate and electrically connected to the electrode,
   wherein the power supply rod is brazed to the connector by using a conductive filler.

7. The ceramic susceptor of claim 6, wherein the power supply rod is formed in a single rod and is in contact with the connector to extend through the separator and the mount via the inner space of the shaft.

8. The ceramic susceptor of claim 6, wherein the connector and the power supply rod are made of an identical material.

9. The ceramic susceptor of claim 1, wherein the electrode is a heating element, an electrode for generating plasma, or a chuck electrode for an electrostatic chuck function.

10. The ceramic susceptor of claim 1, wherein the electrode is a heating element, and the ceramic susceptor further comprises a chuck electrode for an electrostatic chuck function, disposed within the insulation plate and spaced apart from the electrode.

11. The ceramic susceptor of claim 1, wherein when the vacuum chuck function is performed using the first through-passage and the second through-passage, an electrostatic chuck function is further performable using the electrode.

* * * * *